(12) United States Patent
Fernandes et al.

(10) Patent No.: US 10,691,183 B2
(45) Date of Patent: Jun. 23, 2020

(54) APPARATUS, SYSTEM, AND METHOD FOR MINIMIZING INSTALLATION FOOTPRINTS OF EXPANSION CARDS

(71) Applicant: Facebook, Inc., Menlo Park, CA (US)

(72) Inventors: John Edward Fernandes, Fremont, CA (US); Jon Brian Ehlen, Menlo Park, CA (US)

(73) Assignee: Facebook, Inc., Menlo Park, CA (US)

( * ) Notice: Subject to any disclaimer, the term of this patent is extended or adjusted under 35 U.S.C. 154(b) by 3 days.

(21) Appl. No.: 15/873,819

(22) Filed: Jan. 17, 2018

(65) Prior Publication Data
US 2019/0220070 A1    Jul. 18, 2019

(51) Int. Cl.
| | |
|---|---|
| *G06F 1/18* | (2006.01) |
| *G06F 1/20* | (2006.01) |
| *H01R 12/72* | (2011.01) |
| *H01R 12/70* | (2011.01) |
| *H05K 7/14* | (2006.01) |
| *H05K 1/11* | (2006.01) |

(52) U.S. Cl.
CPC ............ *G06F 1/185* (2013.01); *G06F 1/18* (2013.01); *G06F 1/20* (2013.01); *H01R 12/7005* (2013.01); *H01R 12/721* (2013.01); *H05K 7/1405* (2013.01); *H01R 2201/06* (2013.01); *H05K 1/117* (2013.01); *H05K 7/1402* (2013.01)

(58) Field of Classification Search
CPC ....... G06F 1/185; G06F 1/20; H01R 12/7005; H01R 12/721; H01R 2201/06; H05K 1/117; H05K 7/1402
See application file for complete search history.

(56) References Cited

U.S. PATENT DOCUMENTS

| | | | | | |
|---|---|---|---|---|---|
| 5,155,663 | A | * | 10/1992 | Harase | G06K 19/07732 273/148 B |
| 5,483,422 | A | * | 1/1996 | Bowen | G06K 7/0047 235/486 |
| 5,650,917 | A | * | 7/1997 | Hsu | H05K 7/1407 361/727 |
| 5,860,828 | A | * | 1/1999 | Anderson | G06K 19/077 439/377 |
| 5,941,775 | A | * | 8/1999 | Naka | G11C 8/12 273/148 B |

(Continued)

*Primary Examiner* — James Wu
*Assistant Examiner* — Hung Q Dang
(74) *Attorney, Agent, or Firm* — FisherBroyles, LLP

(57) ABSTRACT

An apparatus for minimizing installation footprints of expansion cards may include one or more expansion cards that include a short edge, a long edge that is longer than the short edge and is substantially perpendicular to the short edge, and an edge connector disposed on the short edge. The apparatus may also include an expansion-card frame dimensioned to 1) guide an expansion card toward a printed circuit board of a computing device at a substantially vertical orientation such that the short edge of the expansion card is disposed proximate the printed circuit board of the computing device and the long edge of the expansion card extends away from the printed circuit board and 2) removably couple the edge connector disposed on the short edge of the expansion card to the printed circuit board of the computing device. Various other apparatuses, systems, and methods are also disclosed.

19 Claims, 10 Drawing Sheets

(56) References Cited

U.S. PATENT DOCUMENTS

| | | | | |
|---|---|---|---|---|
| 6,193,339 B1 * | 2/2001 | Behl | ............... | G11B 33/02 |
| | | | | 312/223.2 |
| 6,385,040 B2 * | 5/2002 | Nabetani | ............ | G06K 7/0082 |
| | | | | 361/679.31 |
| 6,457,647 B1 * | 10/2002 | Kurihashi | ........... | G06K 7/0047 |
| | | | | 235/441 |
| 6,643,125 B2 * | 11/2003 | Nabetani | ............ | G06K 7/0082 |
| | | | | 361/679.32 |
| 2012/0218705 A1 * | 8/2012 | Huang | ............ | G06F 1/187 |
| | | | | 361/679.37 |
| 2013/0294023 A1 * | 11/2013 | Gay | ............ | G06F 1/187 |
| | | | | 361/679.31 |
| 2018/0285311 A1 * | 10/2018 | Su | ............ | G06F 15/76 |

\* cited by examiner

Expansion-Card Frame 100

APPARATUS, SYSTEM, AND METHOD FOR MINIMIZING INSTALLATION FOOTPRINTS OF EXPANSION CARDS

BACKGROUND

Computing systems often require upgrades and modifications to keep up with changing computational power or data storage needs. For example, a large data center may require additional storage components or higher-capacity memory as old storage becomes full. Traditionally, upgrades may be performed by swapping out older components with newer parts or adding expansion cards to existing systems. However, systems that require frequent upgrades or a large volume of expansion components may experience difficulties in easily adding new components. For example, traditional methods of mounting expansion cards, such as screwing expansion cards flat onto a printed circuit board, require the appropriate tools and a certain amount of space on the printed circuit board.

Unfortunately, the amount of available space on a printed circuit board or similar mounting board may be limited as more expansion cards are added. Moreover, with the addition of expansion cards, the power consumption of the entire computing system may increase. To counteract increased heat in the system due to the increased power consumption, traditional cooling methods may create cutouts on the printed circuit board to improve airflow or add other cooling elements to the printed circuit board. However, these cutouts and methods also occupy valuable real estate that could otherwise seat additional expansion components. Furthermore, the need for extra tools to install expansion cards in some systems can make installation unnecessarily difficult. Therefore, better methods of installing a multitude of expansion components are required to overcome these traditional disadvantages and avoid overheating the system.

SUMMARY

As will be described in greater detail below, the instant disclosure describes various apparatuses, systems, and methods for minimizing installation footprints of expansion cards by removably installing expansion cards using a guiding frame. In one example, an apparatus may include one or more expansion cards that include a short edge, a long edge that is longer than the short edge and is substantially perpendicular to the short edge, and an edge connector disposed on the short edge. The apparatus may also include an expansion-card frame dimensioned to 1) guide an expansion card toward a printed circuit board of a computing device at a substantially vertical orientation such that the short edge of the expansion card is disposed proximate the printed circuit board of the computing device and the long edge of the expansion card extends away from the printed circuit board, and 2) removably couple the edge connector disposed on the short edge of the expansion card to the printed circuit board of the computing device.

In some embodiments, a pinout of the edge connector may conform to an M.2 pinout specification, a U.2 pinout specification, or an mSATA pinout specification. In these embodiments, the expansion-card frame may include one or more expansion sockets dimensioned to accept the pinout of the edge connector.

In some examples, the expansion-card frame may include an edge-connector adapter dimensioned to electronically couple the edge connector disposed on the short edge of the expansion card to the printed circuit board of the computing device and one or more card guides dimensioned to extend from the edge-connector adapter and slotted such that the long edge of the expansion card slides along a card guide toward the edge-connector adapter. In these examples, a latch may be coupled to a distal end of the expansion card such that one or more protrusions disposed on the latch locks to an aperture along the card guide of the expansion-card frame and a force applied to pinch the latch unlocks the expansion card from a locked position in the expansion-card frame.

In one embodiment, one or more heatsink elements may be coupled to a face of the expansion card to cool the expansion card. In this embodiment, a heatsink element may be coupled to the face of the expansion card by mounting the heatsink element to the expansion card and/or coupling the heatsink element to the expansion-card frame such that the heatsink element is within a proximity of the expansion card. Additionally, in this embodiment, the heatsink element may include a conducive material that facilitates heat transfer away from the face of the expansion card.

According to various embodiments, a corresponding computing system may include a chassis dimensioned to hold computing hardware. The computing system may also include one or more printed circuit boards mounted to the chassis. Additionally, the computing system may include one or more expansion cards that include a short edge, a long edge that is longer than the short edge and is substantially perpendicular to the short edge, and an edge connector disposed on the short edge. Furthermore, the computing system may include one or more expansion-card frames coupled to a printed circuit board, wherein an expansion-card frame is dimensioned to 1) guide an expansion card toward the printed circuit board at a substantially vertical orientation such that the short edge of the expansion card is disposed proximate the printed circuit board and the long edge of the expansion card extends away from the printed circuit board and 2) removably couple the edge connector disposed on the short edge of the expansion card to the printed circuit board.

In one example, the printed circuit board may be mounted to the chassis such that a surface of the printed circuit board is exposed to removably install the expansion card to the printed circuit board.

In one embodiment, the expansion-card frame may include an edge-connector adapter dimensioned to accept a pinout of the edge connector disposed on the short edge of the expansion card at an expansion socket and electronically couple the edge connector to the printed circuit board in the chassis. Additionally, the expansion-card frame may include one or more card guides dimensioned to extend from the edge-connector adapter and slotted such that the long edge of the expansion card slides along a card guide toward the edge-connector adapter. In this embodiment, a latch may be coupled to a distal end of the expansion card such that one or more protrusions disposed on the latch lock to an aperture along the card guide of the expansion-card frame and a force applied to pinch the latch unlocks the expansion card from the printed circuit board.

In the above embodiment, the expansion-card frame may be coupled to the printed circuit board by removably mounting the expansion-card frame to the printed circuit board, extruding the expansion-card frame from a part of the printed circuit board, removably mounting the expansion-card frame to the chassis such that the edge-connector adapter electronically couples to the printed circuit board, and/or extruding the expansion-card frame from a part of the chassis such that the edge-connector adapter electronically couples to the printed circuit board. Furthermore, in this embodiment, a key-in feature may be disposed at the short edge of the expansion card such that the key-in feature locks the expansion card to the extruded expansion-card frame and fully seats the edge connector in the expansion socket of the extruded expansion-card frame.

In some examples, one or more heatsink elements may be coupled to a face of the expansion card in the above computing system by mounting a heatsink element to the expansion card or by coupling the heatsink element to the expansion-card frame such that the heatsink element is within a proximity of the expansion card. In these examples, the heatsink element may cool the expansion card by facilitating heat transfer away from the face of the expansion card.

Furthermore, a corresponding expansion-card frame for minimizing installation footprints of expansion cards may include an edge-connector adapter dimensioned to electronically couple one or more edge connectors disposed on a short edge of an expansion card to a printed circuit board of a computing device. The expansion-card frame may also include one or more card guides dimensioned to extend from the edge-connector adapter and slotted to guide the expansion card toward the printed circuit board of the computing device at a substantially vertical orientation such that the short edge of the expansion card is disposed proximate the printed circuit board of the computing device and a long edge of the expansion card, which is longer than and substantially perpendicular to the short edge of the expansion card, extends away from the printed circuit board.

In some embodiments, the edge-connector adapter above may include one or more expansion sockets dimensioned to accept a pinout of an edge connector of the expansion card.

In some examples, a card guide may be dimensioned to fit around the long edge of the expansion card such that the expansion card slides along the card guide toward the edge-connector adapter. Additionally, the card guide may be dimensioned such that an opposing card guide fits around a parallel long edge of the expansion card.

In one embodiment, a coupling mechanism may couple the edge-connector adapter to the printed circuit board by locking the edge-connector adapter to a fixed position on the printed circuit board. Additionally or alternatively, the coupling mechanism may couple the edge-connector adapter to a chassis dimensioned to hold the printed circuit board such that the edge-connector adapter electronically couples to the printed circuit board.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1A:
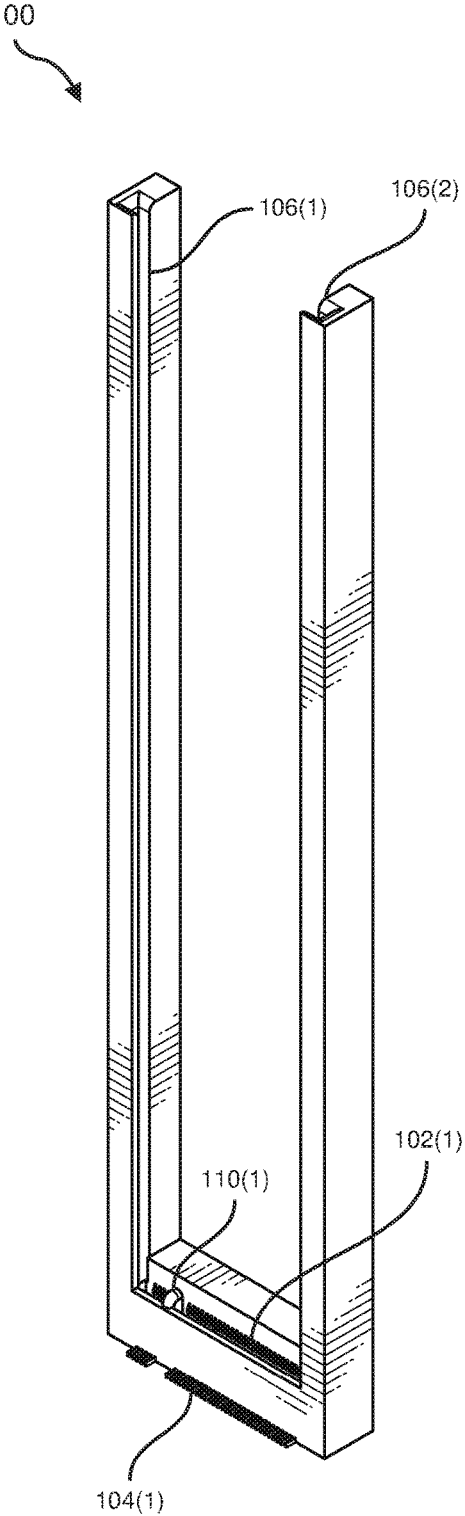
FIG. 1A and FIG. 1B are perspective views of exemplary expansion-card frames.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes and illustrates various apparatuses, systems, and methods for minimizing installation footprints of expansion cards. As will be explained in greater detail below, embodiments of the instant disclosure may improve expansion card installation and removal by coupling expansion cards to printed circuit boards via an expansion-card frame that guides expansion cards into a vertical alignment, or at a substantial angle, to a printed circuit board. Additionally, heatsinks may be directly coupled to expansion cards or to the expansion-card frame to improve cooling. Furthermore, a latch may be coupled to an expansion card to facilitate easier and faster installation and removal of the expansion card. Thus, the embodiments described herein may improve the mounting of expansion cards and reduce the footprints of the expansion cards on the printed circuit board.

Figure 1B:
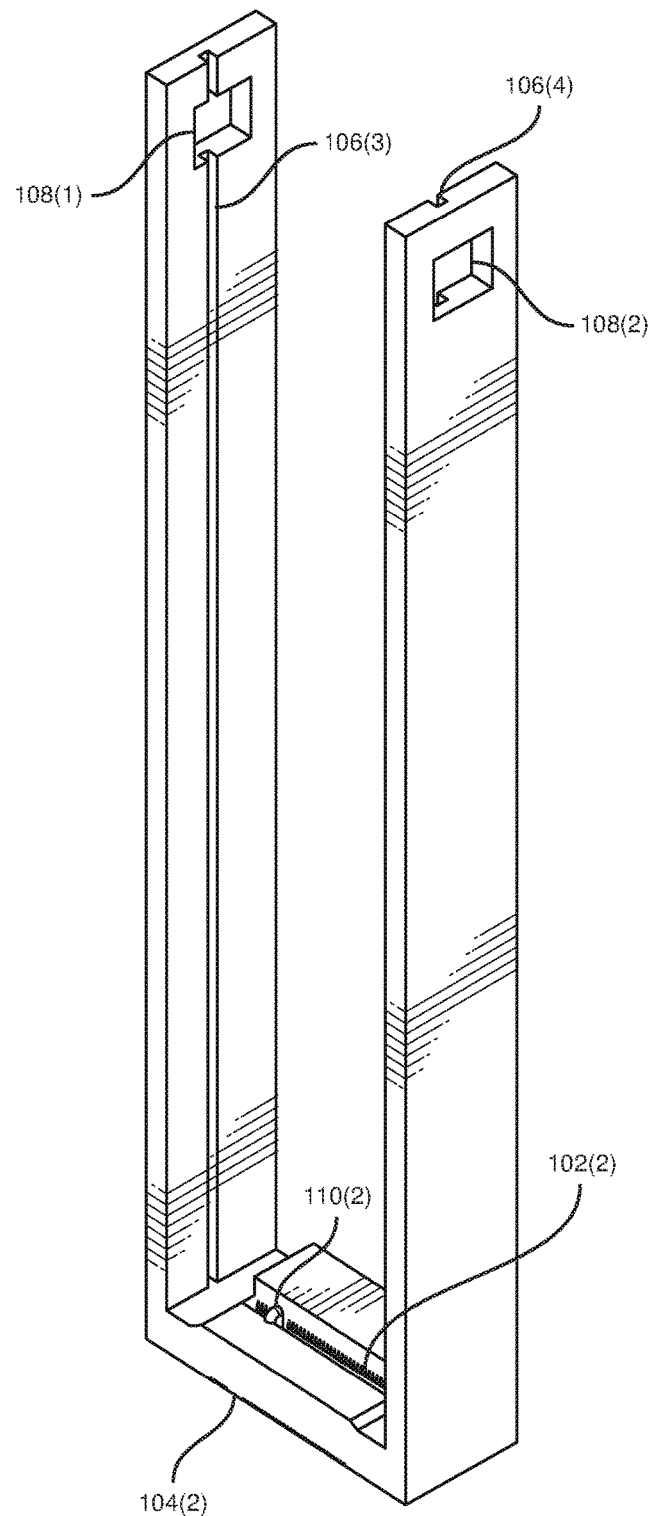

The following will provide, with reference to FIGS. 1A and 1B, detailed descriptions of exemplary expansion-card frames. In addition, the discussion associated with FIGS. 2-4 will provide examples of expansion cards and exemplary latches and heatsinks coupled to expansion cards. The discussion associated with FIGS. 5-8 will provide examples of apparatuses that include expansion cards and expansion-card frames and the installation and removal of expansion cards. Furthermore, detailed descriptions of expansion-card frames coupling expansion cards to a printed circuit board will be provided in connection with FIG. 9. Finally, the discussion corresponding to FIG. 10 will provide examples of computing systems implementing the apparatuses described herein to reduce the installation footprints of expansion cards.

As used herein, the term "expansion card" generally refers to a component, such as a card formed from a printed circuit board, that is configured for insertion into a corresponding computing device or expansion socket to expand the functionality of the computing device. The term "printed circuit board," as used herein, generally refers to a physical board on which computing components may be attached or embedded such that the board provides electrical connections between the computing components.

The terms "computing device" and "computing system," as used herein, generally refer to any type or form of computing hardware or software that is capable of reading computer-executable instructions. Examples of computing devices and/or computing systems may include, without limitation, endpoint devices, embedded systems, servers, memory devices, data centers, combinations of one or more of the same, and/or any other suitable computing device or system.

FIGS. 1A and 1B illustrate perspective views of variations of an expansion-card frame 100. Expansion-card frame 100 may be dimensioned to guide an expansion card toward a printed circuit board of a computing device at a substantially vertical orientation such that a short edge of the expansion card is disposed proximate the printed circuit board and a long edge of the expansion card extends away from the printed circuit board. Expansion-card frame 100 may also be dimensioned to removably couple an edge connector disposed on the short edge of the expansion card to the printed circuit board. The term "edge connector," as used herein, generally refers to one or more connections at an edge of an expansion component that couple the component to a corresponding computing bus or computing device. In some examples, the edge connector may be formed from a portion of a printed circuit board and/or include traces or pins designed to connect to a matching socket.

In some embodiments, expansion-card frame 100 may include an expansion socket 102(1) in FIG. 1A or an expansion socket 102(2) in FIG. 1B dimensioned to accept a pinout of the edge connector. As used herein, the term "expansion socket" generally refers to a socket or slot dimensioned to accept an expansion component in a nested fashion and electronically connects to the expansion component. The term "pinout," as used herein, generally refers to a cross-reference between the contacts, or pins, of an electrical connector or electronic component.

In some examples, expansion-card frame 100 may include an edge-connector adapter 104(1) in FIG. 1A or an edge-connector adapter 104(2) in FIG. 1B dimensioned to electronically couple the edge connector disposed on the short edge of the expansion card to the printed circuit board. The term "edge-connector adapter," as used herein, generally refers to an adapter that includes one or more expansion sockets to accept expansion components at an input connection and electronically couples to a separate computing component at an output connection. For example, edge-connector adapter 104(1) includes expansion socket 102(1) dimensioned to accept a pinout of the edge connector of the expansion card. Similarly, edge-connector adapter 104(2) includes expansion socket 102(2) dimensioned to accept the same pinout of the edge connector.

Expansion-card frame 100 may additionally include card guides 106(1) and 106(2) in FIG. 1A and card guides 106(3) and 106(4) in FIG. 1B. Card guides 106(1)-(4) may be dimensioned to extend from edge-connector adapters 104(1) and 104(2) and slotted such that the long edge of the expansion card slides along card guides 106(1)-(4) toward edge-connector adapters 104(1) and 104(2). For example, card guides 106(1) and 106(2) may guide the expansion card toward the printed circuit board at the substantially vertical orientation by facilitating the sliding of the expansion card along the slots, which end at expansion socket 102(1) of edge-connector adapter 104(1).

In some examples, key-in features 110(1) or 110(2) may lock the expansion card to expansion-card frame 100 and fully seat the edge connector in expansion socket 102(1) and 102(2), respectively. For example, key-in features 110(1) and/or 110(2) may represent protrusions in expansion-card frame 100 that fit to a recess in the expansion card pinout. Additionally or alternatively, key-in features 110(1) and/or 110(2) may represent mechanisms attached to the expansion card to lock to a portion of expansion-card frame 100. Although not illustrated, additional examples of key-in features may be coupled to expansion-card frame 100 and/or the expansion card to ensure the expansion card is electronically coupled to expansion sockets 102(1) and/or 102(2). Additionally, in the example of FIG. 1B, an aperture 108(1) and an aperture 108(2) may be disposed along card guides 106(3) and 106(4) to lock the expansion card in place to expansion-card frame 100.

Figure 2:
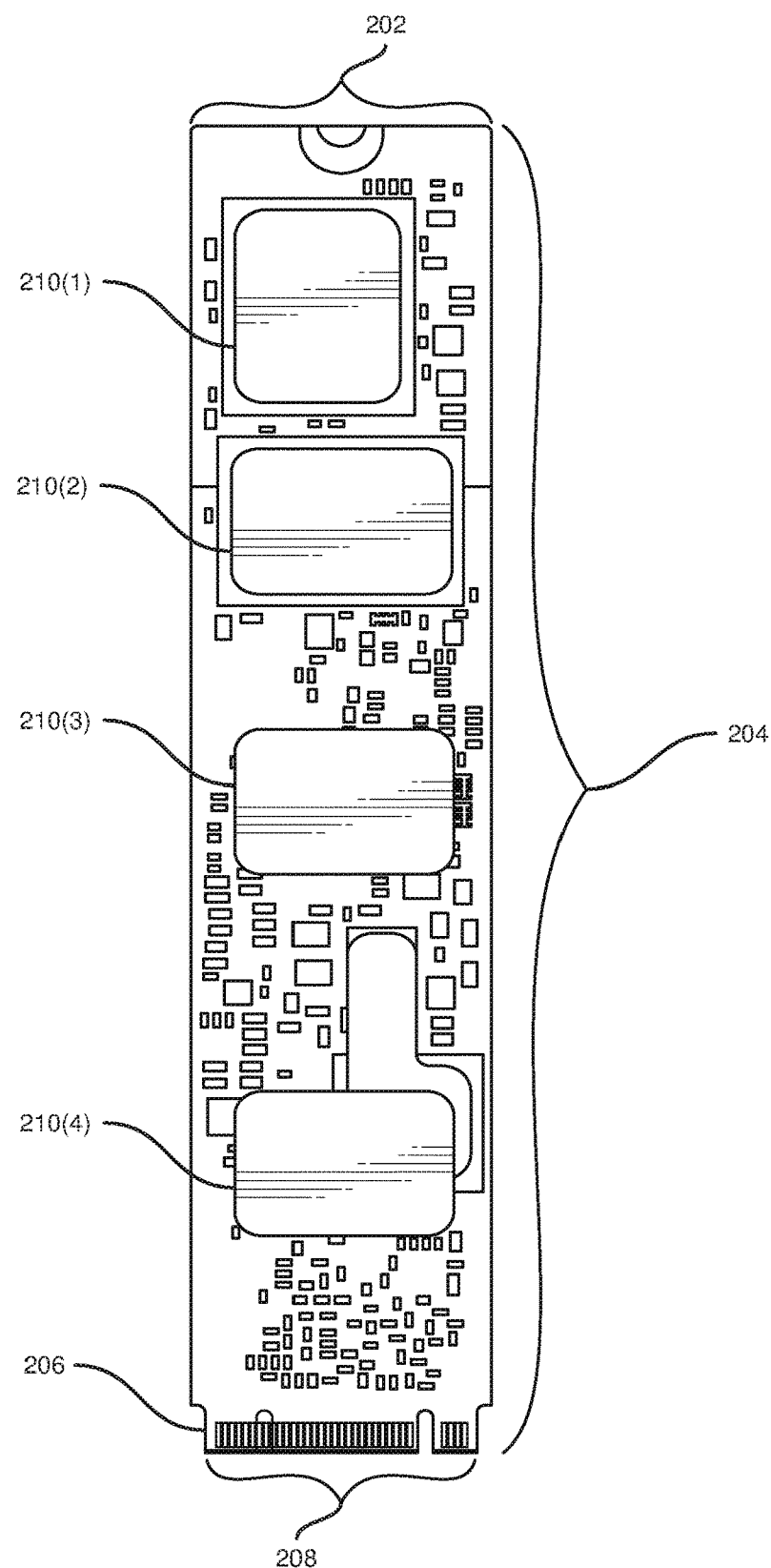
FIG. 2 is a front view of an exemplary expansion card.

FIG. 2 illustrates a front view of an expansion card 200 that includes a short edge 202, a long edge 204 that is longer than short edge 202 and is substantially perpendicular to short edge 202, and an edge connector 206 disposed on an additional short edge parallel to short edge 202. A pinout 208 on edge connector 206 may conform to an M.2 pinout specification, a U.2 pinout specification, and/or an mSATA pinout specification.

In one embodiment, one or more heatsink elements may be coupled to a face of expansion card 200 to cool expansion card 200. The term "heatsink," as used herein, generally refers to an apparatus that absorbs and transfers heat from a device to fluid or air, thereby cooling the device through a process of thermal transfer. In this embodiment, a heatsink element may be coupled to the face of expansion card 200 by mounting the heatsink element to expansion card 200. In the example of FIG. 2, thermal pads 210(1)-(4) may be coupled to the face of expansion card 200 by adhesive methods to cool expansion card 200.

In some embodiments, the heatsink element may include a conducive material that facilitates heat transfer away from the face of expansion card 200. For example, thermal pads 210(1)-(4) may represent pads made of silicone to conduct heat away from computing components on expansion card 200. Thus, heatsink elements may cool the expansion card by facilitating heat transfer away from the face of the expansion card.

Figure 3:
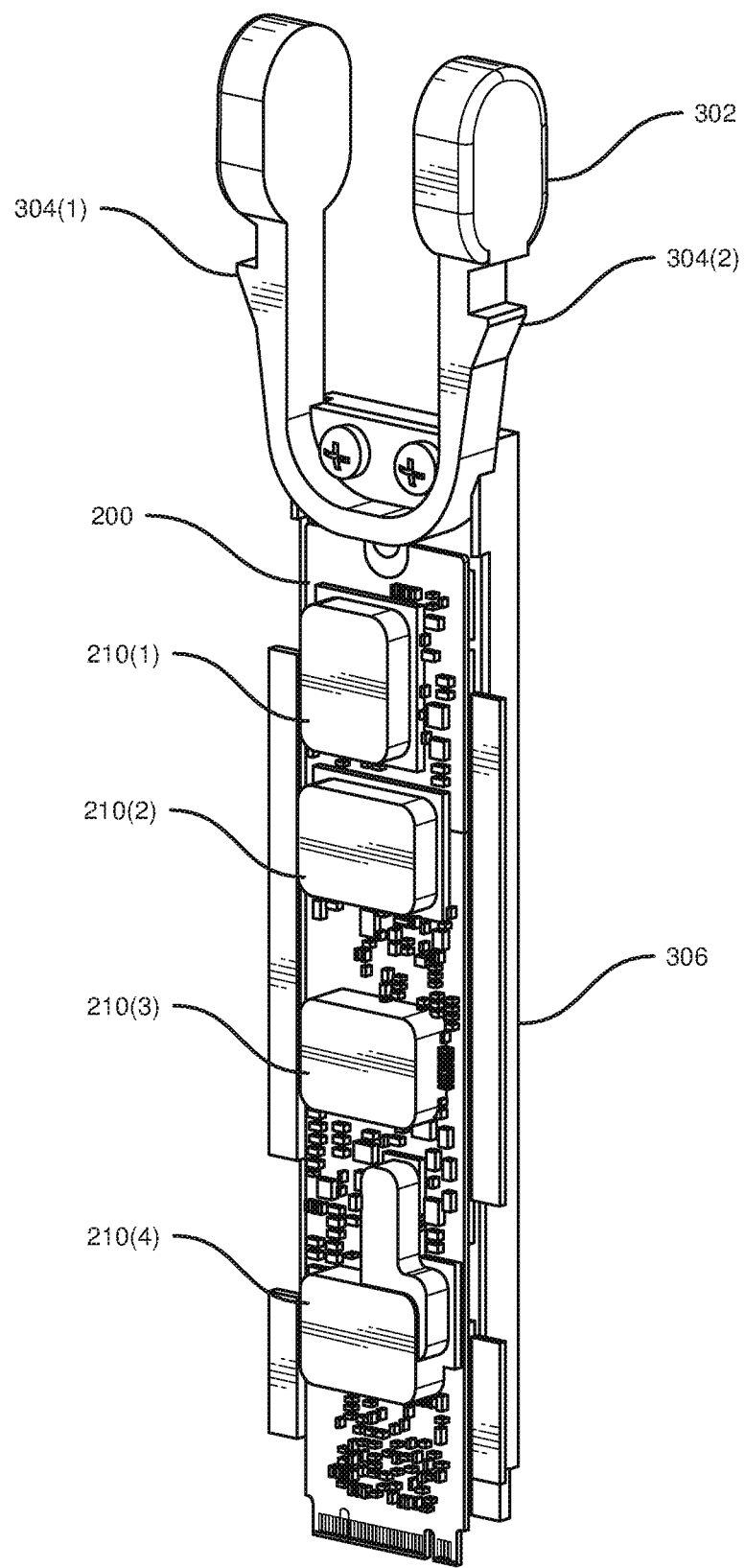
FIG. 3 is a perspective view of an exemplary latch coupled to an expansion card.

FIG. 3 illustrates a perspective view of a latch 302 coupled to expansion card 200. In some embodiments, latch 302 may be coupled to a distal end of expansion card 200 such that protrusions 304(1) and 304(2), disposed on latch 302, lock to apertures along card guides of the expansion-card frame, such as apertures 108(1) and 108(2) of FIG. 1B.

In the example of FIG. 3, a heatsink element 306 may be coupled to a back of expansion card 200 in addition to thermal pads 210(1)-(4). In some examples, heatsink element 306 may be coupled to the back face of expansion card 200 by coupling to an expansion-card frame, such as expansion-card frame 100 of FIG. 1B. In these examples, heatsink element 306 may be within a proximity of expansion card 200 to effectively facilitate heat transfer. Alternatively, heatsink element 306 may be directly coupled to expansion card 200, such as by attaching screws, or within a proximity of the face of expansion card 200 as a casing of expansion card 200. Additionally, heatsink element 306 may represent a conducive material such as sheet metal. For example, in low-powered systems, conducive material used in the casing or the expansion-card frame may be sufficient to provide heat transfer from expansion card 200.

Figure 4:
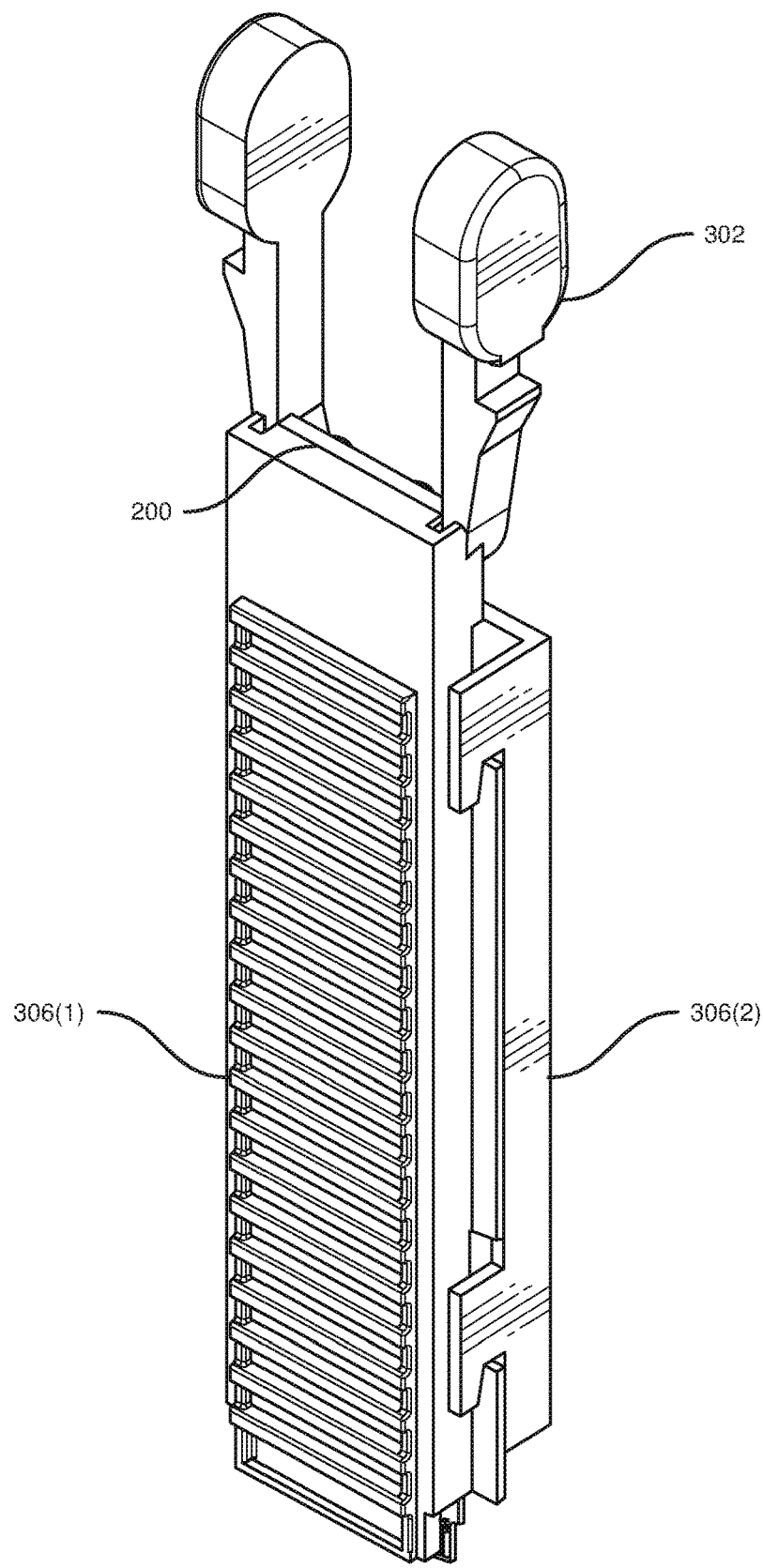
FIG. 4 is a perspective view of a latch and heatsink elements coupled to an expansion card.

FIG. 4 illustrates a back view of latch 302 and heatsink elements 306(1) and 306(2) coupled to expansion card 200. In this example, heatsink element 306(1) may represent a traditional heatsink, such as a heatsink with fins, that provides additional surface area for heat dissipation. Heatsink element 306(1) of FIG. 4 may represent heatsink element 306 of FIG. 3. Additionally, heatsink element 306(2) may represent sheet metal that provides a casing for expansion card 200 and additional heat dissipation to cooling airflow. In these examples, heatsink elements 306(1) and/or 306(2) may be coupled to expansion card 200 or expansion-card frame 100 of FIG. 1B.

Figure 5:
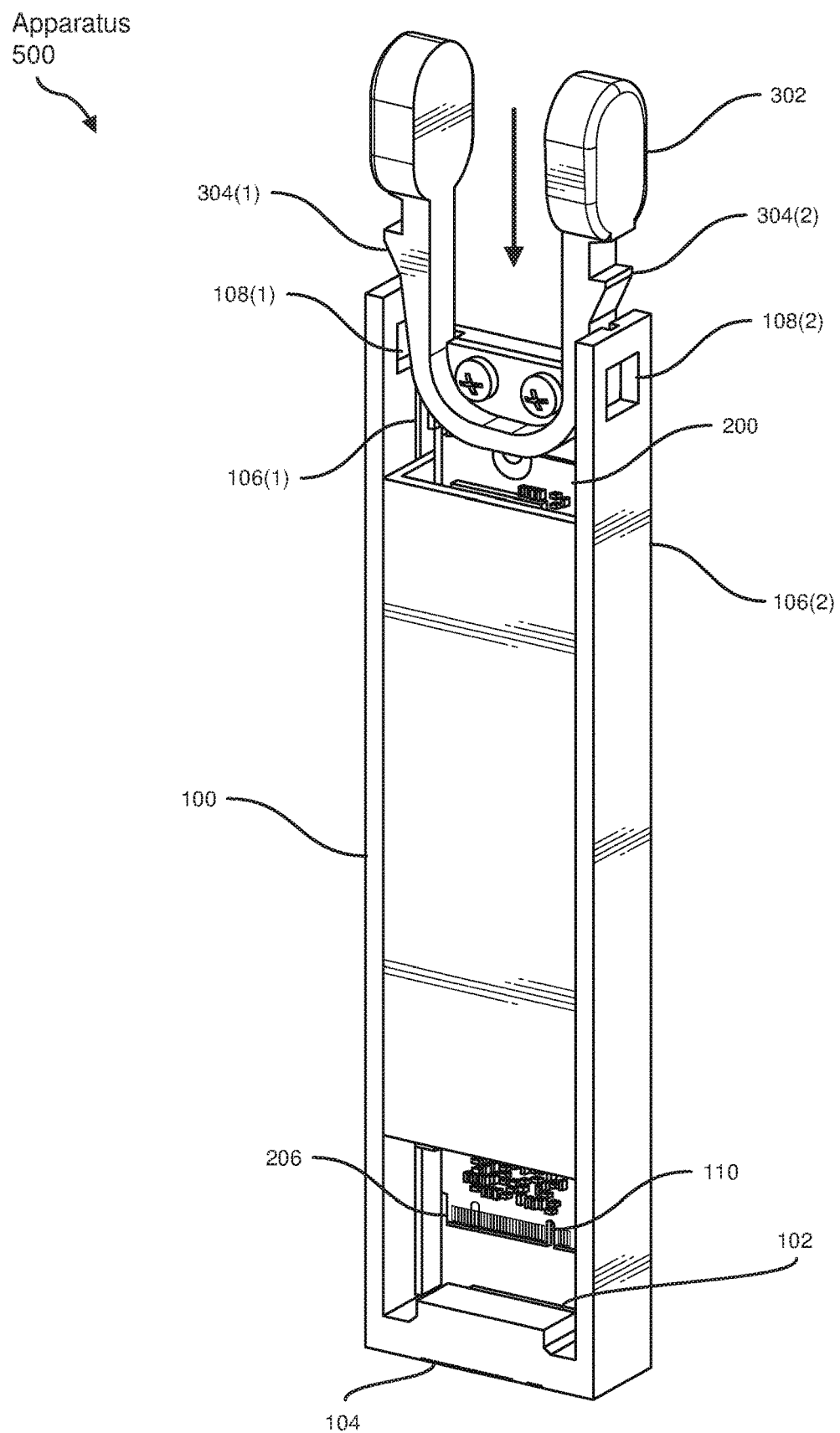
FIG. 5 is a perspective view of an installation of an expansion card to an expansion-card frame.

FIG. 5 illustrates a perspective view of an installation of expansion card 200 to expansion-card frame 100. In one embodiment, an apparatus 500 may include expansion card 200 and expansion-card frame 100 dimensioned to guide expansion card 200 toward a printed circuit board of a computing device and removably couple edge connector 206 disposed on expansion card 200 to the printed circuit board. In this embodiment, expansion-card frame 100 includes an edge-connector adapter 104 that accepts edge connector 206 at an expansion socket 102.

Additionally, expansion-card frame 100 of FIG. 5 includes card guides 106(1) and 106(2) that extend from edge-connector adapter 104 such that a downward force applied to expansion card 200 and/or latch 302 may slide expansion card 200 along card guides 106(1) and 106(2) toward expansion socket 102. In this example, card guides 106(1) and 106(2) may represent opposing card guides that fit around the parallel long edges of expansion card 200. The downward force may continue to slide expansion card 200 down until protrusions 304(1) and 304(2) lock to apertures 108(1) and 108(2), respectively.

In some examples, a key-in feature 110 may be disposed at the short edge of expansion card 200. Key-in feature 110 may represent a recess in pinout 208 of expansion card 200 that fits to key-in features 110(1) and/or 110(2) of FIGS. 1A and 1B. Thus, key-in feature 110 and/or protrusions 304(1) and 304(2) may lock expansion card 200 to expansion-card frame 100 such that edge connector 206 is fully seated in expansion socket 102.

Figure 6:
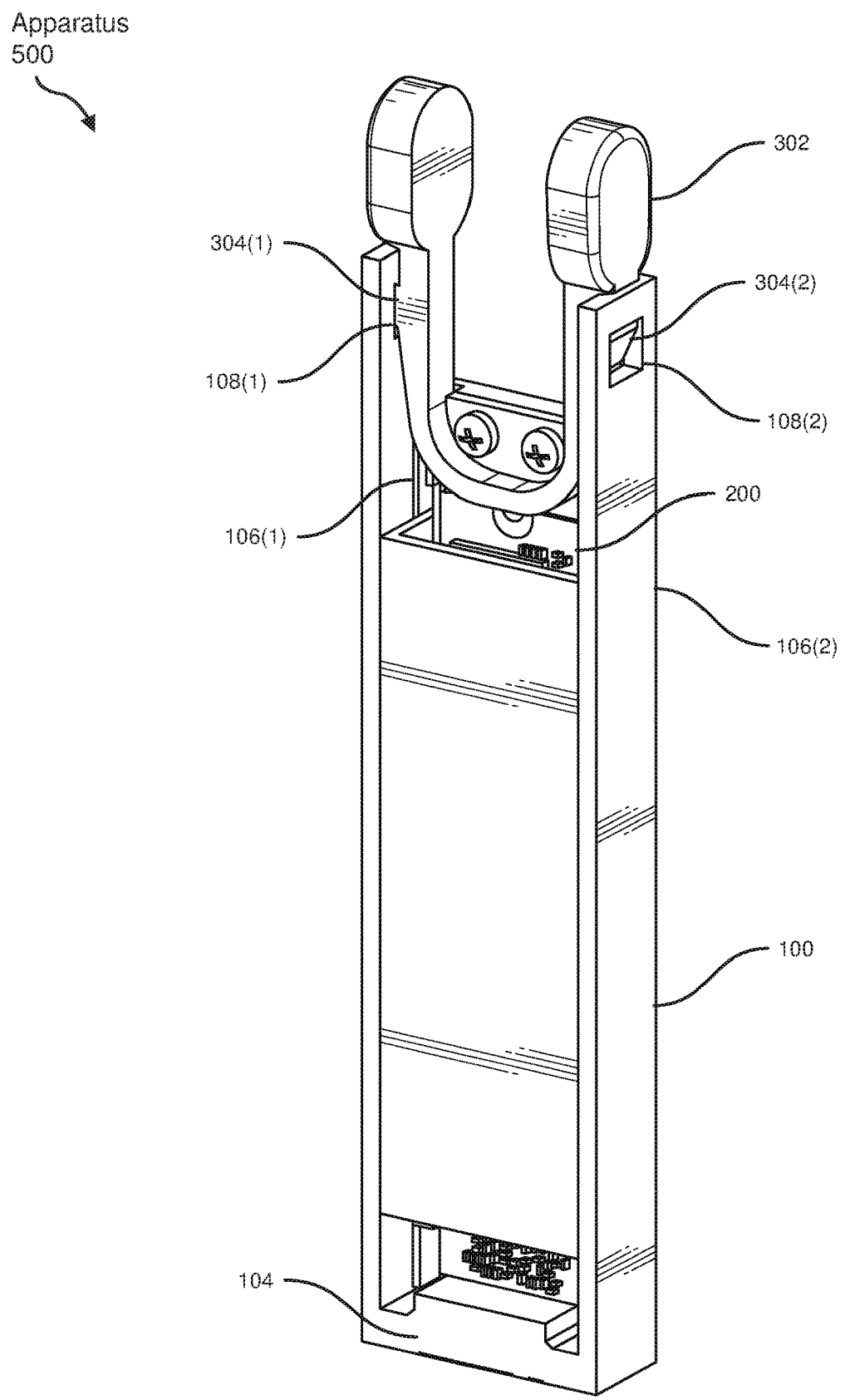
FIG. 6 is a perspective view of an exemplary apparatus for minimizing the installation footprint of an expansion card.

FIG. 6 illustrates a perspective view of apparatus 500 in a locked position. As shown in FIG. 6, protrusions 304(1) and 304(2) on latch 302 may lock to apertures 108(1) and 108(2) along card guides 106(1) and 106(2) of expansion-card frame 100. In this example, latch 302 may be coupled to expansion card 200 to ensure expansion card 200 is locked to edge-connector adapter 104. Edge-connector adapter 104 may then electronically couple expansion card 200 to the printed circuit board.

Figure 7A:
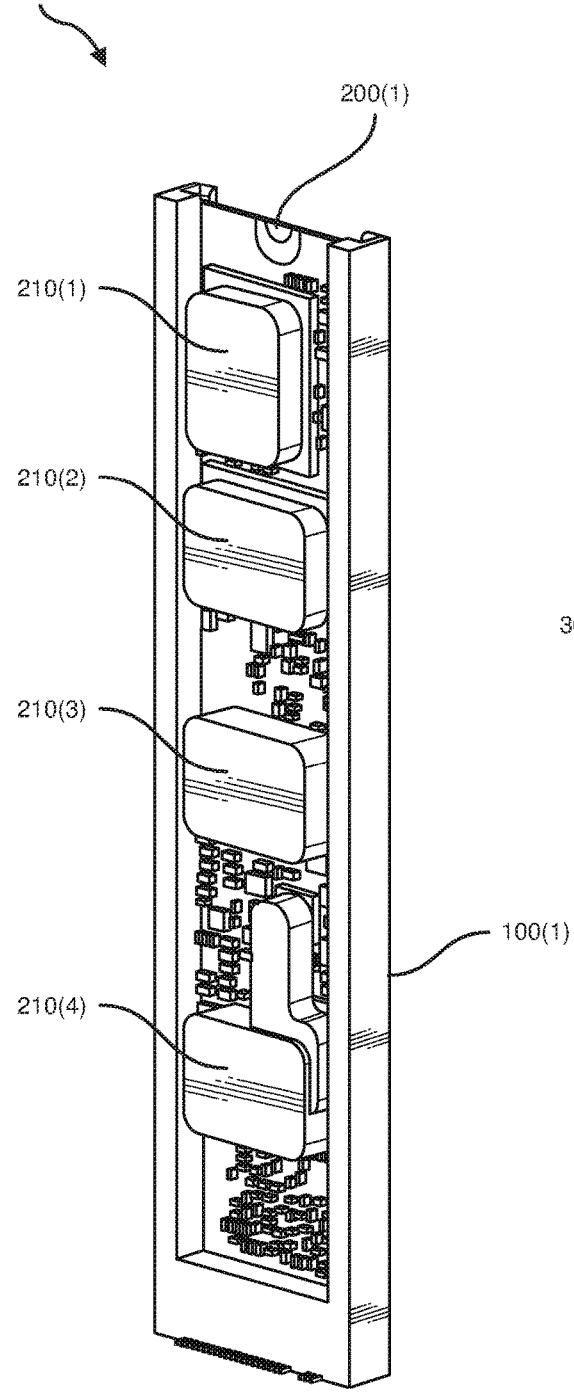
FIG. 7A and FIG. 7B are perspective views of exemplary apparatuses with various heatsink elements.
Figure 7B:
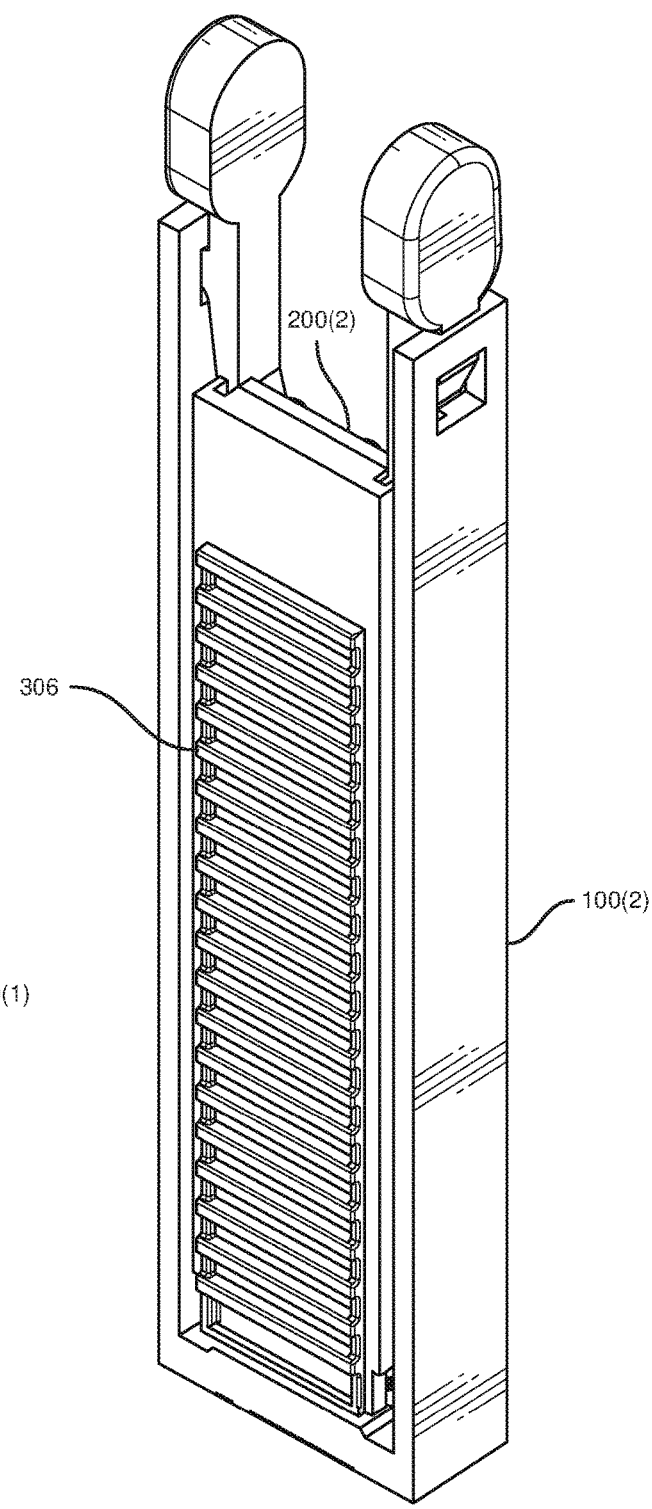

FIGS. 7A and 7B illustrate perspective views of variations of apparatus 500. In the example of FIG. 7A, thermal pads 210(1)-(4) may represent heatsink elements mounted to an expansion card 200(1). In the example of FIG. 7B, heatsink element 306 may be coupled to an expansion-card frame 100(2) and/or an expansion card 200(2) such that heatsink element 306 is within a proximity of expansion card 200(2). In both examples, thermal pads 210(1)-(4) and heatsink element 306 may include conducive materials appropriate for expansion cards 200(1) and/or 200(2) and expansion-card frames 100(1) and/or 100(2). Additional examples of heatsink elements may include pin heatsinks, conductive tape, conductive liquid material, and/or any other variation or combination of heatsinks that may be coupled to or integrated with expansion cards 200(1) and 200(2) and/or expansion-card frames 100(1) and 100(2).

Figure 8:
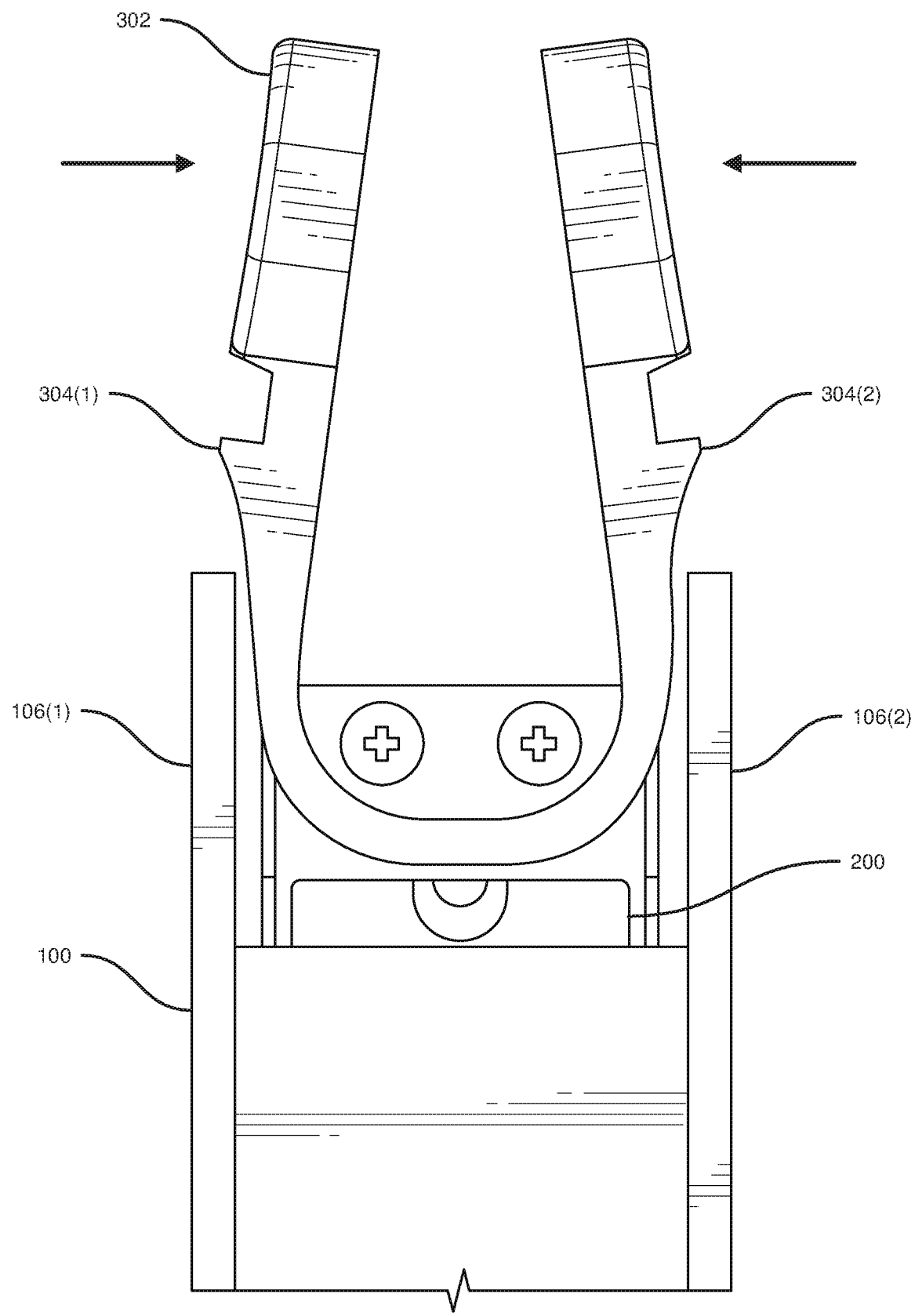
FIG. 8 is a detailed view of a removal of an expansion card from an expansion-card frame.

FIG. 8 illustrates a detailed view of a removal of expansion card 200 from expansion-card frame 100. In some embodiments, latch 302 may facilitate easier installation and/or removal of expansion card 200. For example, a force applied to pinch latch 302 may unlock expansion card 200 from the locked position in expansion-card frame 100. Specifically, the force may push distal ends of latch 302 together such that protrusions 304(1) and 304(2) also move together and away from apertures 108(1) and 108(2) of card guides 106(1) and 106(2). As protrusions 304(1) and 304(2) withdraw from card guides 106(1) and 106(2), expansion card 200 may then be lifted upward and away from expansion-card frame 100, thus unlocking expansion card 200 from the printed circuit board.

Figure 9:
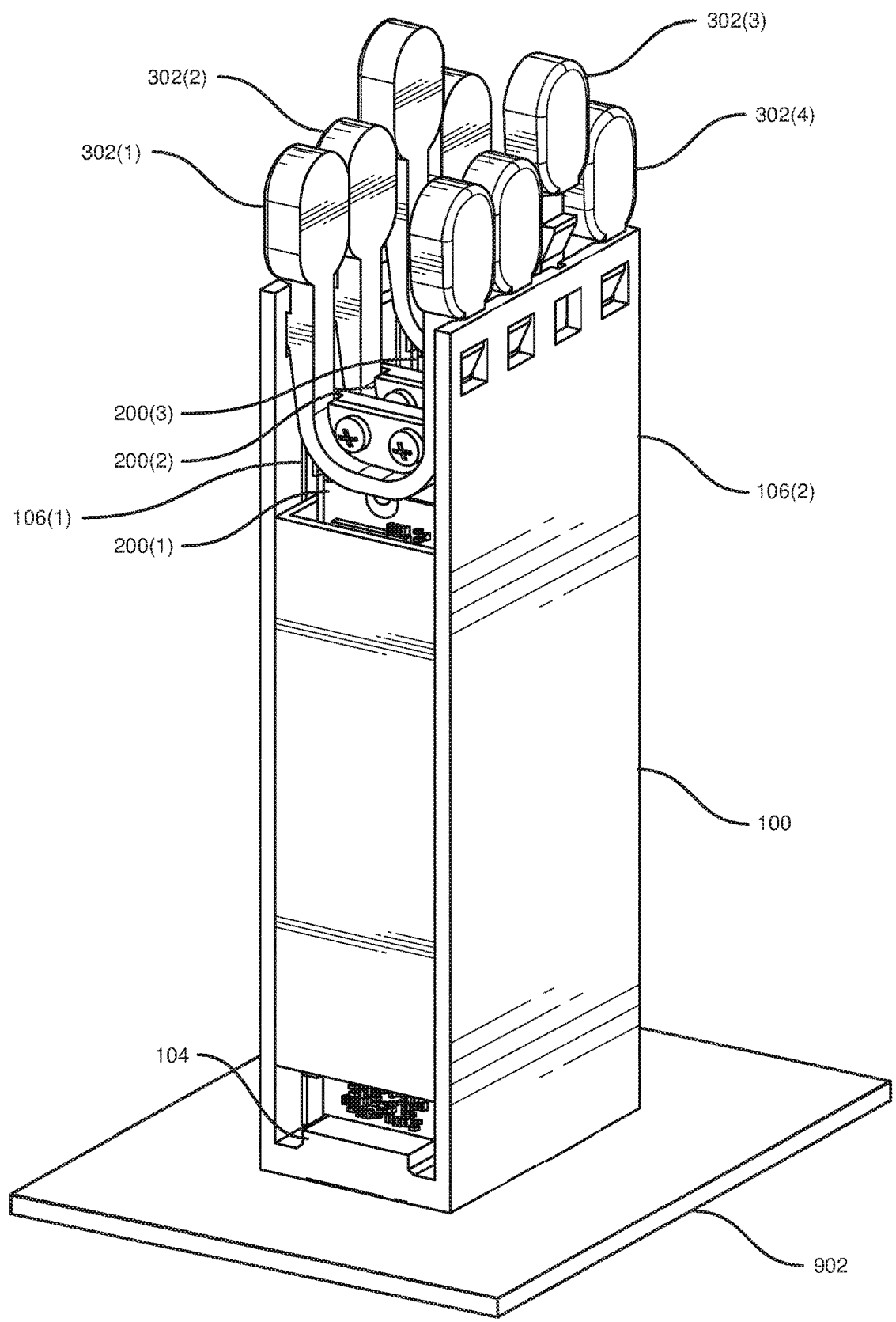
FIG. 9 is a perspective view of an expansion-card frame coupling multiple expansion cards to a printed circuit board.

FIG. 9 illustrates a perspective view of expansion-card frame 100 coupling multiple expansion cards, include expansion cards 200(1)-(3), to a printed circuit board 902. In some examples, edge-connector adapter 104 may electronically couple expansion cards, such as expansion cards 200(1)-(3), to printed circuit board 902. Notably, edge-connector adapter 104 may accept multiple edge connectors and output to a single connector on printed circuit board 902.

In these examples, card guides 106(1) and 106(2) may include multiple slots, each of which may be dimensioned to guide a long edge of an expansion card, and/or multiple apertures. Furthermore, latches 302(1)-(4) may each removably install a single expansion card. For example, latch 302(3) may unlock expansion card 200(3) from expansion-card frame 100 and printed circuit board 902. Furthermore, heatsink elements, such as thermal pads or fins, may be coupled to each expansion card, to expansion-card frame 100, and/or between expansion cards to expansion-card frame 100. For example, thermal pads 210(1)-(4) of FIG. 2 may be coupled to each of expansion cards 200(1)-(3) to provide heat dissipation in the confined space between expansion cards 200(1)-(3).

Figure 10:
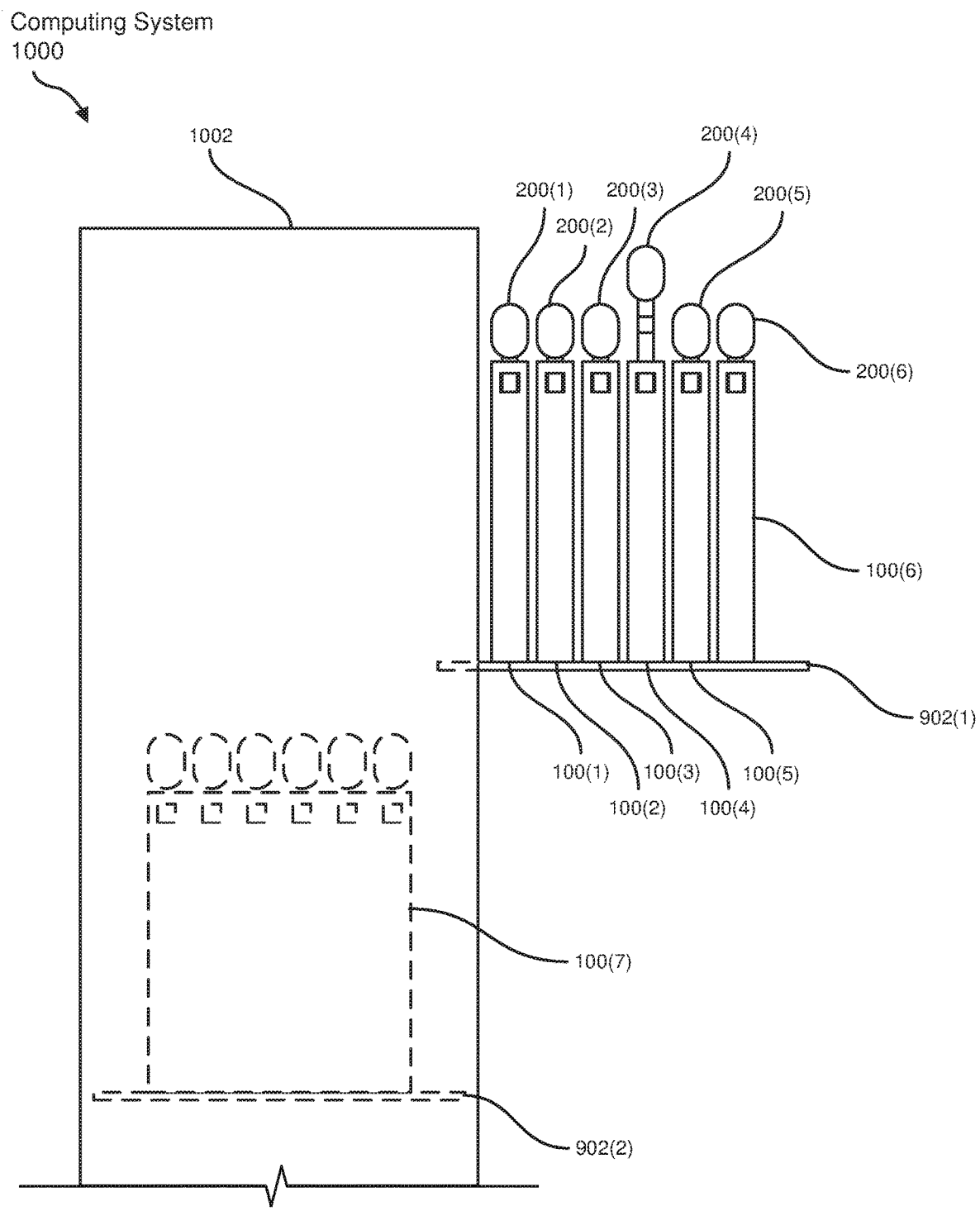
FIG. 10 is a side view of an exemplary computing system with multiple apparatuses coupled to multiple printed circuit boards.

FIG. 10 illustrates a side view of a computing system 1000 with multiple apparatuses coupled to printed circuit boards 902(1) and 902(2). In some embodiments, computing system 1000 may include a chassis 1002 dimensioned to hold computing hardware. Computing system 1000 may also include printed circuit boards 902(1) and 902(2) mounted to chassis 1002. In some examples, printed circuit boards 902(1) and/or 902(2) may be mounted to chassis 1002 such that a surface of printed circuit boards 902(1) and/or 902(2) is exposed to removably install expansion cards, such as expansion cards 200(1)-(6), to printed circuit boards 902(1) and/or 902(2) via expansion-card frames 100(1)-(7). For example, chassis 1002 may represent a data center rack and drawer system, and printed circuit board 902(1) may be pulled out of chassis 1002 such that expansion card 200(4) may be removed from expansion-card frame 100(4).

In one example, expansion-card frames 100(1)-(6) may each electronically couple one of expansion cards 200(1)-(6) to printed circuit board 902(1). In this example, gaps between expansion-card frames 100(1)-(6) may enable more airflow between expansion cards 200(1)-(6), and expansion cards 200(1)-(6) may not require additional heatsink elements beyond conducive material used in expansion-card frames 100(1)-(6). In contrast, expansion-card frame 100(7) may electronically couple multiple expansion cards to printed circuit board 902(2) inside chassis 1002. In this example, the closed design of expansion-card frame 100(7) may require multiple heatsink elements to provide increased heat dissipation for expansion cards installed to printed circuit board 902(2). In other words, the use and/or design of heatsink elements may depend on the number and/or placement of expansion cards in expansion-card frames.

In one embodiment, an expansion-card frame may be coupled to a printed circuit board by removably mounting the expansion-card frame to the printed circuit board. In this embodiment, both expansion-card frames and expansion cards may be installed and/or removed simultaneously. In the example of FIG. 10, expansion-card frames 100(1)-(7) may be coupled to printed circuit boards 902(1) and/or 902(2) by extruding the expansion-card frame from a part of the printed circuit board. Alternatively, expansion-card frames may be coupled to printed circuit boards by removably mounting expansion-card frames to chassis 1002 such that edge-connector adapters electronically couple to printed circuit boards and/or by extruding expansion-card frames from a part of chassis 1002 such that edge-connector adapters electronically couple to printed circuit boards. In these alternate embodiments, expansion-card frames may be extruded from chassis material, such as sheet metal, which may be stronger than separate parts mounted to printed circuit boards 902(1) and/or 902(2) or chassis 1002. Furthermore, expansion-card frames coupled to chassis 1002 may especially require key-in features to ensure expansion cards fit to printed circuit boards 902(1) and/or 902(2).

Although not illustrated, in some examples, a coupling mechanism may couple edge-connector adapters to printed circuit boards 902(1) and/or 902(2) by locking the edge-connector adapters to a fixed position on printed circuit boards 902(1) and/or 902(2). Alternatively, the coupling mechanism may couple the edge-connector adapters to chassis 1002 such that the edge-connector adapters electronically couple to printed circuit boards 902(1) and/or 902(2). For example, apparatus 500 of FIG. 7A may be removably installed to printed circuit board 902(1) as a unit. In this example, the coupling mechanism may mechanically couple apparatus 500 to chassis 1002 such that edge-connector adapter 104(1) of FIG. 1A remains in contact with the surface of printed circuit board 902(1). Thus, either expansion card 200(1) and/or apparatus 500 may be removably installed.

In further embodiments, expansion-card frames 100(1)-(7) may be mounted to printed circuit boards 902(1) and 902(2) at various non-horizontal angles, based on the space requirements of chassis 1002. For example, for embodiments in which printed circuit boards 902(1) and 902(2) are stored closer together, the distance between printed circuit boards 902(1) and 902(2) may not permit perpendicular mounting of expansion-card frames 100(1)-(7). Thus, expansion-card frames 100(1)-(7) may be designed at an acute angle to facilitate mounting expansion cards at a slant to printed circuit boards 902(1) and 902(2).

The systems and apparatuses presented herein may be manufactured, assembled, used, adjusted, or otherwise configured or created in a variety of ways by any individual and/or by any suitable type or form of manual and/or automated apparatus. For example, various methods may dimension an expansion card with a short edge and a long edge that is shorter than the short edge and substantially perpendicular to the short edge. The methods may dispose an edge connector on the short edge of the expansion card with a pinout. The methods may also dimension an edge-connector adapter on an expansion-card frame to electronically couple the edge connector to a printed circuit board of a computing device. Additionally, the methods may extend one or more card guides from the edge-connector adapter to guide the expansion card toward an expansion socket on the edge-connector adapter and the printed circuit board. The methods may also couple a latch to a distal end of the expansion card such that one or more protrusions disposed on the latch locks to one or more apertures along the card guides and a force applied to pinch the latch unlocks the expansion card from the expansion-card frame. Furthermore, various methods may couple one or more heatsink elements to a face of the expansion card to cool the expansion card by facilitating heat transfer away from the face of the expansion card.

As discussed throughout the instant disclosure, the disclosed methods, systems, and apparatuses may provide one or more advantages over traditional methods of mounting expansion cards to computing systems. For example, by employing expansion-card frames that vertically couple expansion cards to horizontal printed circuit boards, the methods, systems, and apparatuses described herein may increase the density of cards mounted on a limited area of a printed circuit board. By integrating heatsinks in the expansion-card frames or mounting heatsinks to the expansion cards, the methods, systems, and apparatuses described herein may further reduce the need for cooling cutouts on printed circuit boards. The decrease in cutouts may then reduce layout complexity and improve electronic routing while providing additional reduction of space reserved for expansion card purposes. Furthermore, by coupling latches to expansion cards for easy installation and removal, the disclosed methods, systems, and apparatuses may reduce the amount of time taken to service expansion cards. Thus, the mechanisms described herein may enable easier installation of a larger number of expansion components.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   at least one expansion card that comprises:
      a short edge;
      a long edge that is longer than the short edge and is substantially perpendicular to the short edge; and an edge connector disposed on the short edge;
an edge-connector adapter dimensioned to electronically couple the edge connector to a printed circuit board of a computing device; and
an expansion-card frame dimensioned to:
guide the at least one expansion card toward the printed circuit board of the computing device at a substantially vertical orientation such that the short edge of the at least one expansion card is disposed proximate the printed circuit board of the computing device and the long edge of the at least one expansion card extends away from the printed circuit board; and
removably couple the edge connector disposed on the short edge of the at least one expansion card to the printed circuit board of the computing device, the at least one expansion card including a multi-pronged latch coupled to a distal end thereof, such that protrusions disposed on each prong of the multi-pronged latch lock to a corresponding aperture in the expansion-card frame, wherein a force applied to pinch the multi-pronged latch unlocks the at least one expansion card from the printed circuit board,
wherein a heatsink element is directly coupled to and is directly contacting a face of the at least one expansion card and is also directly coupled to the expansion-card frame,
wherein the expansion card frame positions the at least one expansion card along with one or more additional expansion cards in an ordered row of expansion cards, each expansion card being positioned behind the at least one expansion card in the ordered row, such that the short edge of each expansion card is disposed proximate the printed circuit board of the computing device and the long edge of each expansion card extends away from the printed circuit board within the ordered row of expansion cards, and
wherein the edge-connector adaptor is further dimensioned to accept multiple edge connectors to connect multiple expansion cards to the printed circuit board.

2. The apparatus of claim 1, wherein a pinout of the edge connector conforms to at least one of:
an M.2 pinout specification;
a U.2 pinout specification; or
an mSATA pinout specification.

3. The apparatus of claim 2, wherein the expansion-card frame comprises at least one expansion socket dimensioned to accept the pinout of the edge connector.

4. The apparatus of claim 1, wherein the expansion-card frame further comprises:
at least one card guide dimensioned to extend from the edge-connector adapter and slotted such that the long edge of the expansion card slides along the card guide toward the edge-connector adapter.

5. The apparatus of claim 4, wherein the multi-pronged latch is coupled to a distal end of the expansion card such that:
at least one protrusion disposed on the multi-pronged latch locks to an aperture along the card guide of the expansion-card frame; and
a force applied to pinch the multi-pronged latch unlocks the expansion card from a locked position in the expansion-card frame.

6. The apparatus of claim 1, wherein the heatsink element is coupled to the face of the expansion card by at least one of:
mounting the heatsink element to the expansion card; or
coupling the heatsink element to the expansion-card frame such that the heatsink element is within a proximity of the expansion card.

7. The apparatus of claim 1, wherein the heatsink element comprises a conductive material that facilitates heat transfer away from the face of the expansion card.

8. A computing system comprising:
a chassis dimensioned to hold computing hardware;
at least one printed circuit board mounted to the chassis;
at least one expansion card that comprises:
a short edge;
a long edge that is longer than the short edge and is substantially perpendicular to the short edge; and
an edge connector disposed on the short edge;
an edge-connector adapter dimensioned to electronically couple the edge connector to a printed circuit board of a computing device; and
at least one expansion-card frame coupled to the printed circuit board, wherein the expansion-card frame is dimensioned to:
guide the at least one expansion card toward the printed circuit board at a substantially vertical orientation such that the short edge of the at least one expansion card is disposed proximate the printed circuit board and the long edge of the at least one expansion card extends away from the printed circuit board; and
removably couple the edge connector disposed on the short edge of the at least one expansion card to the printed circuit board, the at least one expansion card including a multi-pronged latch coupled to a distal end thereof, such that protrusions disposed on each prong of the multi-pronged latch lock to a corresponding aperture in the expansion-card frame, wherein a force applied to pinch the multi-pronged latch unlocks the at least one expansion card from the printed circuit board,
wherein a heatsink element is directly coupled to and is directly contacting a face of the at least one expansion card and is also directly coupled to the expansion-card frame,
wherein the expansion card frame positions the at least one expansion card along with one or more additional expansion cards in an ordered row of expansion cards, each expansion card being positioned behind the at least one expansion card in the ordered row, such that the short edge of each expansion card is disposed proximate the printed circuit board of the computing device and the long edge of each expansion card extends away from the printed circuit board within the ordered row of expansion cards, and
wherein the edge-connector adaptor is further dimensioned to accept multiple edge connectors to connect multiple expansion cards to the printed circuit board.

9. The computing system of claim 8, wherein the printed circuit board is mounted to the chassis such that a surface of the printed circuit board is exposed to removably install the expansion card to the printed circuit board.

10. The computing system of claim 8, wherein the expansion-card frame further comprises:
at least one card guide dimensioned to extend from the edge-connector adapter and slotted such that the long edge of the expansion card slides along the card guide toward the edge-connector adapter.

11. The computing system of claim 10, wherein the multi-pronged latch is coupled to a distal end of the expansion card such that:
   at least one protrusion disposed on the multi-pronged latch locks to an aperture along the card guide of the expansion-card frame; and
   a force applied to pinch the multi-pronged latch unlocks the expansion card from the printed circuit board.

12. The computing system of claim 10, wherein the expansion-card frame is coupled to the printed circuit board by at least one of:
   removably mounting the expansion-card frame to the printed circuit board;
   extruding the expansion-card frame from a part of the printed circuit board;
   removably mounting the expansion-card frame to the chassis such that the edge-connector adapter electronically couples to the printed circuit board; or
   extruding the expansion-card frame from a part of the chassis such that the edge-connector adapter electronically couples to the printed circuit board.

13. The computing system of claim 12, wherein a key-in feature is disposed at the short edge of the expansion card such that the key-in feature:
   locks the expansion card to the extruded expansion-card frame; and
   fully seats the edge connector in the expansion socket of the extruded expansion-card frame.

14. The computing system of claim 8, wherein the heatsink element is coupled to a face of the expansion card by at least one of: mounting the heatsink element to the expansion card; or coupling the heatsink element to the expansion-card frame such that the heatsink element is within a proximity of the expansion card.

15. The computing system of claim 14, wherein the heatsink element cools the expansion card by facilitating heat transfer away from the face of the expansion card.

16. An expansion-card frame comprising:
   an edge-connector adapter dimensioned to electronically couple a plurality of edge connectors disposed on a short edge of an expansion card to a printed circuit board of a computing device; and
   at least one card guide dimensioned to extend from the edge-connector adapter and slotted to guide the expansion card toward the printed circuit board of the computing device at a substantially vertical orientation such that the short edge of the expansion card is disposed proximate the printed circuit board of the computing device and a long edge of the expansion card, which is longer than and substantially perpendicular to the short edge of the expansion card, extends away from the printed circuit board,
   wherein the expansion card includes a multi-pronged latch coupled to a distal end thereof, such that protrusions disposed on each prong of the multi-pronged latch lock to a corresponding aperture in the expansion-card frame, wherein a force applied to pinch the multi-pronged latch unlocks the expansion card from the printed circuit board,
   wherein a heatsink element is directly coupled to and is directly contacting a face of the expansion card and is also directly coupled to the expansion-card frame,
   wherein the expansion card frame positions the expansion card along with one or more additional expansion cards in an ordered row of expansion cards, each expansion card being positioned behind the expansion card in the ordered row, such that the short edge of each expansion card is disposed proximate the printed circuit board of the computing device and the long edge of each expansion card extends away from the printed circuit board within the ordered row of expansion cards.

17. The expansion-card frame of claim 16, wherein the edge-connector adapter comprises at least one expansion socket dimensioned to accept a pinout of the edge connector of the expansion card.

18. The expansion-card frame of claim 16, wherein the card guide is dimensioned to fit around the long edge of the expansion card such that:
   the expansion card slides along the card guide toward the edge-connector adapter; and
   an opposing card guide fits around a parallel long edge of the expansion card.

19. The expansion-card frame of claim 16, wherein a coupling mechanism couples the edge-connector adapter to the printed circuit board by at least one of:
   locking the edge-connector adapter to a fixed position on the printed circuit board; or
   coupling the edge-connector adapter to a chassis dimensioned to hold the printed circuit board such that the edge-connector adapter electronically couples to the printed circuit board.

* * * * *